(12) United States Patent
Xu

(10) Patent No.: US 7,554,468 B2
(45) Date of Patent: Jun. 30, 2009

(54) ENTROPY DECODING METHODS AND APPARATUS USING MOST PROBABLE AND LEAST PROBABLE SIGNAL CASES

(75) Inventor: Xun Xu, San Jose, CA (US)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 11/844,319

(22) Filed: Aug. 23, 2007

(65) Prior Publication Data

US 2008/0048893 A1 Feb. 28, 2008

Related U.S. Application Data

(60) Provisional application No. 60/823,605, filed on Aug. 25, 2006, provisional application No. 60/823,613, filed on Aug. 25, 2006, provisional application No. 60/823,620, filed on Aug. 25, 2006.

(51) Int. Cl.
*H03M 7/00* (2006.01)
(52) U.S. Cl. .......................................... 341/107; 341/50
(58) Field of Classification Search ............ 341/90–150
See application file for complete search history.

(56) References Cited

U.S. PATENT DOCUMENTS

| | | | |
|---|---|---|---|
| 5,768,481 A * | 6/1998 | Chan et al. .................. | 358/1.2 |
| 5,805,735 A * | 9/1998 | Chen et al. .................. | 382/239 |
| 6,115,496 A * | 9/2000 | Nguyen et al. .............. | 382/166 |
| 2002/0143792 A1 * | 10/2002 | Belu .......................... | 707/200 |

OTHER PUBLICATIONS

U.S. Appl. No. 60/823,605 to Shan Liu et al., entitled "System and Methods for Detecting and Handling Errors in a Multi-Threaded Video Data Decoder", filed Aug. 25, 2006.
U.S. Appl. No. 60/823,613 to Shan Liu, entitled "Methods and Apparatus for Concealing Corrupted Blocks of Video Data", filed Aug. 25, 2006.
U.S. Appl. No. 60/823,620 to Xun Xu, entitled "Entropy Decoding Methods and Apparatus", filed Aug. 25, 2006.
U.S. Appl. No. 11/844,302, to Shan Liu, entitled "Methods and Apparatus for Concealing Corrupted Blocks of Video Data", filed Aug. 23, 2007.
U.S. Appl. No. 11/844,287, to Shan Liu et al, entitled "System and Methods for Detecting and Handling Errors in a Multi-Threaded Video Data Decoder", filed Aug. 23, 2007.

(Continued)

*Primary Examiner*—Lam T Mai
(74) *Attorney, Agent, or Firm*—Joshua D. Isenberg; JDI Patent

(57) ABSTRACT

Methods and apparatus for entropy decoding are disclosed. Compressed input data representing one or more signals is loaded into one or more registers. A first candidate value for a most probable signal case is prepared from the input data. A second candidate value for a least probable signal case is prepared from the input data. A final signal value for the one or more signals is selected from the first and second candidate values and an output bin value is generated based on the final signal value. A processor readable medium having embodied therein processor readable instructions for implementing the method for entropy decoding is also disclosed. In addition, a method of avoiding a branch instruction in an electronic processing algorithm is disclosed.

32 Claims, 6 Drawing Sheets

OTHER PUBLICATIONS

Sony Computer Entertainment Incorporated, "Cell Broadband Engine Architecture", Version 1.0, Aug. 8, 2005.
"*Draft of Version 4 of H.264/AVC (ITU-T Recommendation H.264 and ISO/IEC 14496-10 (MPEG-4 pat 10) Advanced Video Coding)*" by Gary Sullivan, Thomas Wiegand and Ajay Luthra - Joint Video Team (JVT) of ISO/IEC MPEG & ITU-T VCEG (ISO/IEC JTC1/SC29/WG11 and ITU-T SG16 Q.6) - 14th Meeting: Hong Kong, CH 18-21 Jan., 2005, 331 pages.

U.S. Appl. No. 12/469,496 filed on May 20, 2009.

* cited by examiner

ENTROPY DECODING METHODS AND APPARATUS USING MOST PROBABLE AND LEAST PROBABLE SIGNAL CASES

PRIORITY CLAIM

This application claims the benefit of priority provisional application No. 60/823,605, to Shan Liu, Jason Wang and Milan Mehta, entitled "SYSTEM AND METHODS FOR DETECTING AND HANDLING ERRORS IN A MULTI-THREADED VIDEO DATA DECODER" filed Aug. 25, 2006, the entire disclosures of which are incorporated herein by reference.

This application claims the benefit of priority Provisional Application No. 60/823,613, to Shan Liu, entitled "METHODS AND APPARATUS FOR CONCEALING CORRUPTED BLOCKS OF VIDEO DATA" filed Aug. 25, 2006, the entire disclosures of which are incorporated herein by reference.

This application claims the benefit of priority Provisional Application No. 60/823,620, to Xun Xu, entitled "ENTROPY DECODING METHODS AND APPARATUS", filed Aug. 25, 2006 the entire disclosures of which are incorporated herein by reference.

CROSS-REFERENCE TO RELATED APPLICATION

This application is related to commonly-assigned, co-pending application Ser. No. 11/844,287, to Shan Liu, Jason Wang and Milan Mehta, entitled "SYSTEM AND METHODS FOR DETECTING AND HANDLING ERRORS IN A MULTI-THREADED VIDEO DATA DECODER", filed the same day, as the present application, the entire disclosures of which are incorporated herein by reference.

This application is related commonly-assigned, co-pending application Ser. No. 11/844,302, to Shan Liu, entitled "METHODS AND APPARATUS FOR CONCEALING CORRUPTED BLOCKS OF VIDEO DATA", filed the same day, as the present application, the entire disclosures of which are incorporated herein by reference.

FIELD OF THE INVENTION

Embodiments of the present invention are related to streaming media and more particularly to entropy decoding of streaming media.

BACKGROUND OF THE INVENTION

Digital signal compression using a coder/decoder (codec) allows streaming media, such as audio or video signals to be transmitted over the Internet or stored on compact discs. A number of different codecs have been developed that follow various compression standards. MPEG-4 AVC (Advanced Video Coding), also known as H.264, is a video compression standard that offers significantly greater compression than its predecessors. The H.264 standard is expected to offer up to twice the compression of the earlier MPEG-2 standard. The H.264 standard is also expected to offer improvements in perceptual quality. As a result, more and more video content is being delivered in the form of AVC(H.264)-coded streams. Two rival DVD formats, the HD-DVD format and the Blu-Ray Disc format support H.264/AVC High Profile decoding as a mandatory player feature. AVC(H.264) coding is described in detail in "Draft of Version 4 of H.264/AVC (ITU-T Recommendation H.264 and ISO/IEC 14496-10 (MPEG-4 part 10) Advanced Video Coding)" by Gary Sullivan, Thomas Wiegand and Ajay Luthra, Joint Video Team (JVT) of ISO/IEC MPEG & ITU-T VCEG (ISO/IEC JTC1/SC29/WG11 and ITU-T SG16 Q.6), 14th Meeting: Hong Kong, CH 18-21 January, 2005, the entire contents of which are incorporated herein by reference for all purposes.

AVC(H.264), like many other codecs uses a layer of encoding referred to as entropy encoding. Entropy encoding is a coding scheme that assigns codes to signals so as to match code lengths with the probabilities of the signals. Typically, entropy encoders are used to compress data by replacing symbols represented by equal-length codes with symbols represented by codes proportional to the negative logarithm of the probability. AVC(H.264) supports 2 entropy encoding schemes, Context Adaptive Variable Length Coding (CAVLC) and Context Adaptive Binary Arithmetic Coding (CABAC). Since CABAC tends to offer about 10% more compression than CAVLC, CABAC is favored by many video encoders in generating AVC(H.264) bitstreams. Decoding the entropy layer of AVC(H.264)-coded data streams can be computationally intensive and may present challenges for devices that decode AVC(H.264)-coded bitstreams using general purpose microprocessors. To decode high bit-rated streams targeted by the Blu-ray or the HD-DVD standards, the hardware needs to be very fast and complex, and the overall system cost could be really high. One common solution to this problem is to design special hardware for CABAC decoding. However, such special hardware can increase the cost of devices such as DVD players, game consoles, and the like that need to decode AVC(H.264)-encoded bitstreams.

The Cell is a general purpose microprocessor and media processor jointly developed by Sony, Toshiba and IBM. The basic configuration of a current generation of the Cell is composed of 1 "Power Processor Element" ("PPE"), and 8 "Synergistic Processing Elements" ("SPE"). An SPE is a Reduced Instruction Set Computing (RISC) processor with 128-bit Single Instruction Multiple Data (SIMD) organization for single and double precision instructions. At 3.2 GHz, each SPE gives a theoretical 25.6 billion floating point operations per second (GFLOPS) of performance, which largely dwarfs the abilities of the SIMD unit in typical desktop CPUs like the Pentium 4 and the Athlon 64. This computing power makes a Cell processor potentially capable of decoding AVC (H.264) high definition streams in real time alone without any help from other hardware.

The Cell's enormous computing power may be attributed to the SIMD structure in SPEs. However, the SIMD structure becomes effective only when the algorithm that utilizes the SPEs is parallelizable. Since the process of CABAC decoding is genetically sequential, the speedup offered by SIMD has not heretofore been utilized to its fullest potential. While traditional performance bottlenecks like inverse discrete cosine transformation (IDCT) may be eliminated by the SIMD structure in SPEs, CABAC decoding presents a potential new bottleneck holding back the overall computational performance of AVC decoding using the Cell. If the task of CABAC decoding is not efficiently carried out, one Cell processor alone would not be able to decode high definition CABAC streams in real time.

It is within this context that embodiments of the present invention arise.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Figure 1:
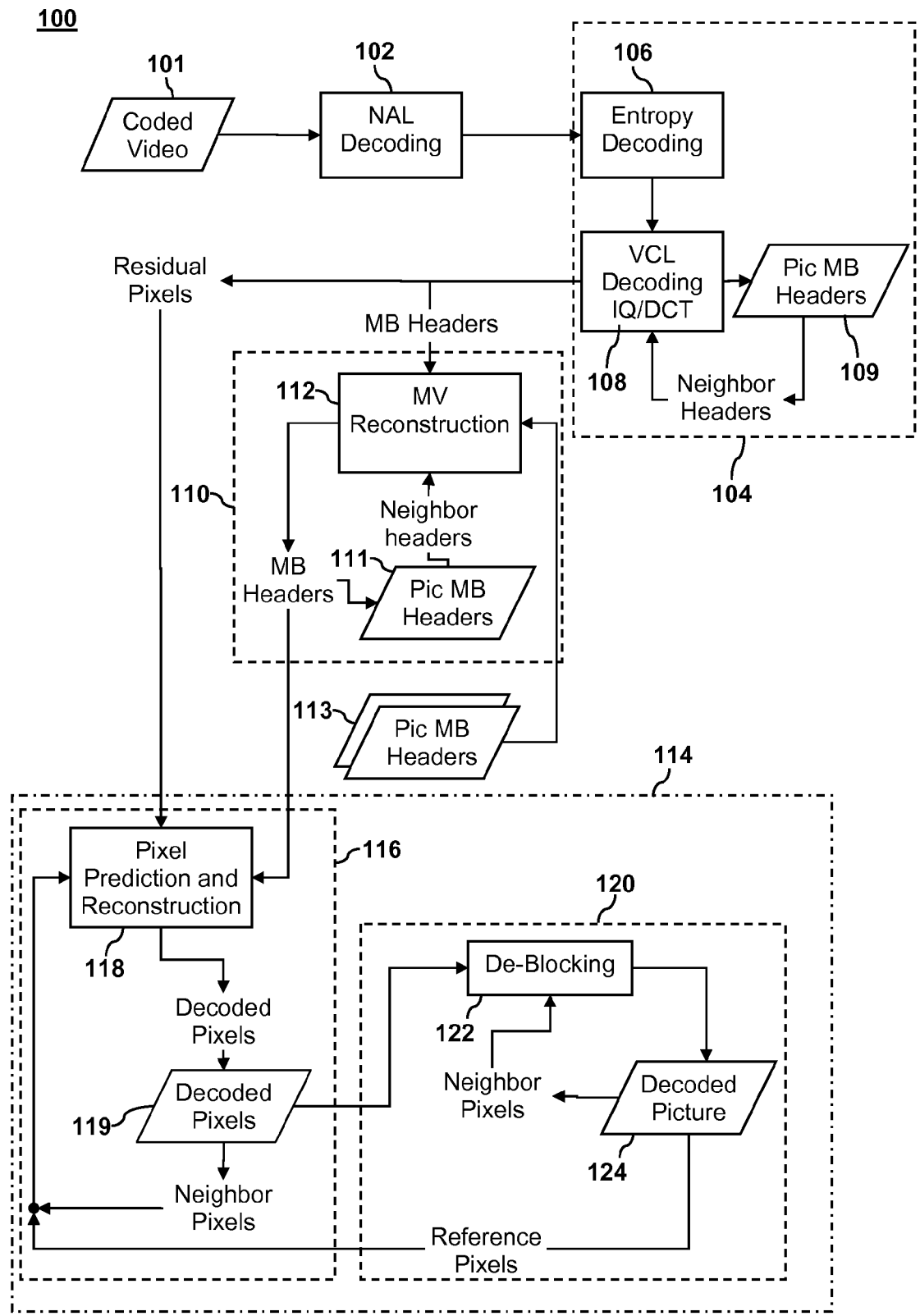
FIG. 1 is a diagram illustrating the general flow streaming data decoding.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

I. Definitions

As used herein the following terms have the following meanings.

adaptive binary arithmetic decoding process: An entropy decoding process that derives the values of bins from a bitstream produced by an adaptive binary arithmetic encoding process.

adaptive binary arithmetic encoding process: An entropy encoding process, not normatively specified in this Recommendation|International Standard, that codes a sequence of bins and produces a bitstream that can be decoded using the adaptive binary arithmetic decoding process.

bin: One bit of a bin string.

binarization: A set of bin strings for all possible values of a syntax element.

binarization process: A unique mapping process of all possible values of a syntax element onto a set of bin strings.

bin string: A string of bins. A bin string is an intermediate binary representation of values of syntax elements from the binarization of the syntax element.

bitstream: A sequence of bits that forms the representation of coded pictures and associated data forming one or more coded video sequences. Bitstream is a collective term used to refer either to a NAL unit stream or a byte stream.

block: An M×N (M-column by N-row) array of samples, or an M×N array of transform coefficients.

bottom field: One of two fields that comprise a frame. Each row of a bottom field is spatially located immediately below a corresponding row of a top field.

bottom macroblock (of a macroblock pair): The macroblock within a macroblock pair that contains the samples in the bottom row of samples for the macroblock pair. For a field macroblock pair, the bottom macroblock represents the samples from the region of the bottom field of the frame that lie within the spatial region of the macroblock pair. For a frame macroblock pair, the bottom macroblock represents the samples of the frame that lie within the bottom half of the spatial region of the macroblock pair.

byte stream: An encapsulation of a NAL unit stream containing start code prefixes and NAL units can: A term used to refer to behavior that is allowed, but not necessarily required.

coded picture: A coded representation of a picture. A coded picture may be either a coded field or a coded frame. Coded picture is a collective term referring to a primary coded picture or a redundant coded picture, but not to both together.

coded representation: A data element as represented in its coded form.

context variable: A variable specified for the adaptive binary arithmetic decoding process of a bin by an equation containing recently decoded bins.

chroma: An adjective specifying that a sample array or single sample is representing one of the two color difference signals related to the primary colors. NOTE—The term chroma is sometimes used rather than the term chrominance in order to avoid the implication of the use of linear light transfer characteristics that is often associated with the term chrominance.

decoded picture: A decoded picture is derived by decoding a coded picture. A decoded picture is either a decoded frame, or a decoded field. A decoded field is either a decoded top field or a decoded bottom field.

decoded picture buffer (DPB): A buffer holding decoded pictures for reference, output reordering, or output delay specified for the hypothetical reference decoder in Annex C.

decoder: An embodiment of a decoding process.

decoding order: The order in which syntax elements are processed by the decoding process.

decoding process: A process that reads a bitstream and derives decoded pictures from it.

encoder: An embodiment of an encoding process.

encoding process: A process that produces a bitstream.

field: An assembly of alternate rows of a frame. A frame is composed of two fields, a top field and a bottom field.

field macroblock: A macroblock containing samples from a single field. All macroblocks of a coded field are field macroblocks. When macroblock-adaptive frame/field decoding is in use, some macroblocks of a coded frame may be field macroblocks.

field macroblock pair: A macroblock pair decoded as two field macroblocks.

flag: A variable that can take one of the two possible values 0 and 1.

frame: A frame contains an array of luma samples and two corresponding arrays of chroma samples. A frame consists of two fields, a top field and a bottom field.

frame macroblock: A macroblock representing samples from the two fields of a coded frame. When macroblock-adaptive frame/field decoding is not in use, all macroblocks of a coded frame are frame macroblocks. When macroblock-adaptive frame/field decoding is in use, some macroblocks of a coded frame may be frame macroblocks.

frame macroblock pair: A macroblock pair decoded as two frame macroblocks.

informative: A term used to refer to content provided herein that is not an integral part of embodiments of the present invention. Informative content does not establish any mandatory requirements any embodiment of the present invention.

instantaneous decoding refresh (IDR) access unit: An access unit in which the primary coded picture is an IDR picture. NO inverse transform: A part of the decoding process by which a set of transform coefficients are converted into spatial-domain values, or by which a set of transform coefficients are converted into DC transform coefficients.

layer: One of a set of syntactical structures in a non-branching hierarchical relationship. Higher layers contain lower layers. Examples of coding layers are the coded video sequence, picture, slice, and macroblock layers.

luma: An adjective specifying that a sample array or single sample is representing the monochrome signal related to the primary colors. NOTE—The term luma is sometimes used rather than the term luminance in order to avoid the implication of the use of linear light transfer characteristics that is often associated with the term luminance.

Macroblock (MB): A 16×16 block of luma samples and two corresponding blocks of chroma samples. The division of a slice or a macroblock pair into macroblocks is a partitioning.

macroblock-adaptive frame/field decoding: A decoding process for coded frames in which some macroblocks may be decoded as frame macroblocks and others may be decoded as field macroblocks.

macroblock pair: A pair of vertically contiguous macroblocks in a frame that is coupled for use in macroblock-adaptive frame/field decoding. The division of a slice into macroblock pairs is a partitioning.

macroblock partition: A block of luma samples and two corresponding blocks of chroma samples resulting from a partitioning of a macroblock for inter prediction.

may: A term used to refer to behavior that is allowed, but not necessarily required.

motion vector: A two-dimensional vector used for inter prediction that provides an offset from the coordinates in the decoded picture to the coordinates in a reference picture.

must: A term used in expressing an observation about a requirement or an implication of a requirement that is specified elsewhere in this application. This term is used exclusively in an informative context.

NAL unit: A syntax structure containing an indication of the type of data to follow and bytes containing that data in the form of an RBSP interspersed as necessary with emulation prevention bytes.

NAL unit stream: A sequence of NAL units.

note: A term used to prefix informative remarks. This term is used exclusively in an informative context.

picture: A collective term for a field or a frame.

raster scan: A mapping of a rectangular two-dimensional pattern to a one-dimensional pattern such that the first entries in the one-dimensional pattern are from the first top row of the two-dimensional pattern scanned from left to right, followed similarly by the second, third, etc. rows of the pattern (going down) each scanned from left to right.

raw byte sequence payload (RBSP): A syntax structure containing an integer number of bytes that is encapsulated in a NAL unit. An RBSP is either empty or has the form of a string of data bits containing syntax elements followed by an RBSP stop bit and followed by zero or more subsequent bits equal to 0.

raw byte sequence payload (RBSP) stop bit: A bit equal to 1 present within a raw byte sequence payload (RBSP) after a string of data bits. The location of the end of the string of data bits within an RBSP can be identified by searching from the end of the RBSP for the RBSP stop bit, which is the last non-zero bit in the RBSP.

should: A term used to refer to behavior that is encouraged to be followed under anticipated ordinary circumstances, but is not a mandatory requirement for an embodiment of the present invention.

slice: An integer number of macroblocks or macroblock pairs ordered consecutively in the raster scan within a particular slice group.

slice data partitioning: A method of partitioning selected syntax elements into syntax structures based on a category associated with each syntax element.

slice group: A subset of the macroblocks or macroblock pairs of a picture.

slice header: A part of a coded slice containing the data elements pertaining to the first or all macroblocks represented in the slice.

start code prefix: A unique sequence of three bytes equal to 0x00000 embedded in the byte stream as a prefix to each NAL unit. The location of a start code prefix can be used by a decoder to identify the beginning of a new NAL unit and the end of a previous NAL unit.

string of data bits (SODB): A sequence of some number of bits representing syntax elements present within a raw byte sequence payload prior to the raw byte sequence payload stop bit.

sub-macroblock: One quarter of the samples of a macroblock, i.e., an 8×8 luma block and two corresponding chroma blocks of which one corner is located at a corner of the macroblock. MAYBE syntax element: An element of data represented in the bitstream.

syntax structure: Zero or more syntax elements present together in the bitstream in a specified order.

top field: One of two fields that comprise a frame. Each row of a top field is spatially located immediately above the corresponding row of the bottom field.

top macroblock (of a macroblock pair): The macroblock within a macroblock pair that contains the samples in the top row of samples for the macroblock pair. For a field macroblock pair, the top macroblock represents the samples from the region of the top field of the frame that lie within the spatial region of the macroblock pair. For a frame macroblock pair, the top macroblock represents the samples of the frame that lie within the top half of the spatial region of the macroblock pair.

transform coefficient: A scalar quantity, considered to be in a frequency domain that is associated with a particular one-dimensional or two-dimensional frequency index in an inverse transform part of the decoding process.

transform coefficient level: An integer quantity representing the value associated with a particular two-dimensional frequency index in the decoding process prior to scaling for computation of a transform coefficient value.

variable length coding (VLC): A reversible procedure for entropy coding that assigns shorter bit strings to symbols expected to be more frequent and longer bit strings to symbols expected to be less frequent.

II. Introduction to AVC(H.264) Decoding

FIG. 1 illustrates the general process flow of AVC(H.264) decoding. Where coded streaming data 101 (e.g., a video data bitstream) has been transferred over a network, e.g., the Internet, the data may initially undergo a process referred to as network abstraction layer (NAL) decoding, indicated at 102. NAL decoding may remove from the data 101 information added to assist in transmitting the data. Such information, referred to as a "network wrapper" may identify the data 101 as video data or indicate a beginning or end of a bitstream, bits for alignment of data, and/or metadata about the video data itself. The remaining decoding may be implemented in four different thread groups or task groups referred to herein as video coded layer (VCL) decoding 104, motion vector reconstruction 110 and picture reconstruction 114, which may include pixel prediction and reconstruction 116 and de-blocking 120.

The VCL decoding process 104 involves a process referred to as Entropy Decoding 106, which is used to decode the VCL syntax. This process may be implemented using methods or apparatus according to embodiments of the present invention, e.g., as indicated below. The VCL decoding process may also involve inverse quantization (IQ) and/or inverse discrete cosine transformation (IDCT) as indicated at 108. These processes may decode the headers from macroblocks 109. The decoded headers 109 may be used to assist in VCL decoding of neighboring macroblocks. The MV reconstruction process 110 may involve motion vector reconstruction 112 using headers from a given macroblock 111 and/or its neighbors 113. A motion vector describes apparent motion within an image. Such motion vectors allow reconstruction of an image (or portion thereof) based on knowledge of the pixels of a prior image and the relative motion of those pixels from image to image. Once the motion vector has been recovered pixels may be reconstructed at 116 using a process of pixel prediction based on residual pixels from the VCL decoding 104 and motion vectors from the MV reconstruction process 110. Pixel prediction and reconstruction 118 produces decoded pixels 119 that included neighbor pixels which may be used as inputs to the pixel prediction and reconstruction process 118 for a subsequent macroblock. The de-blocking task group 120 includes a de-blocking stage 122 that produces a decoded picture 124. The decoded picture may provide neighboring pixels for use in de-blocking a neighboring macroblock. In addition, decoded pictures 124 may provide reference pixels for pixel prediction and reconstruction 118 for subsequent macroblocks.

II. Introduction to AVC(H.264) CABAC Decoding.

As discussed above, the entropy decoding process 106 may potentially produce a bottleneck and efforts at avoiding such bottlenecks give rise to embodiments of the present invention. The example that follows address the process of decoding an AVC(H.264) data stream that has been entropy coded using CABAC. In the process of decoding an AVC (H.264) CABAC stream, almost all of the bits in the bit-stream are consumed by a CABAC entropy decoder (CED). After each decoding, the CED outputs a binary symbol, called a "bin", which is the fundamental building block of all syntax elements. These syntax elements include a lot of binary flags, as well as many non-binary values, such as DCT coefficients. While one bin is enough to determine a binary flag, a non-binary value needs to be constructed out of multiple bins.

Statistics show that on average, 1 bit of encoded signal generates roughly 1.7 binary CABAC bins. Also taking into account a 20% computational performance margin, an input of 40 mpbs HD CABAC stream would require the CABAC entropy decoder to decode about 40×1.7×1.2=81.6 million bins per second. Undoubtedly, the efficiency of CABAC entropy decoding (CED) determines how much computational power would be saved for other tasks, such as constructing output video content from the bins. In a worst case, CED could become a performance bottleneck of an entire AVC (H.264) decoder, preventing it from decoding input streams in real time, independent of the efficiency of other parts of the decoding program.

Figure 2:
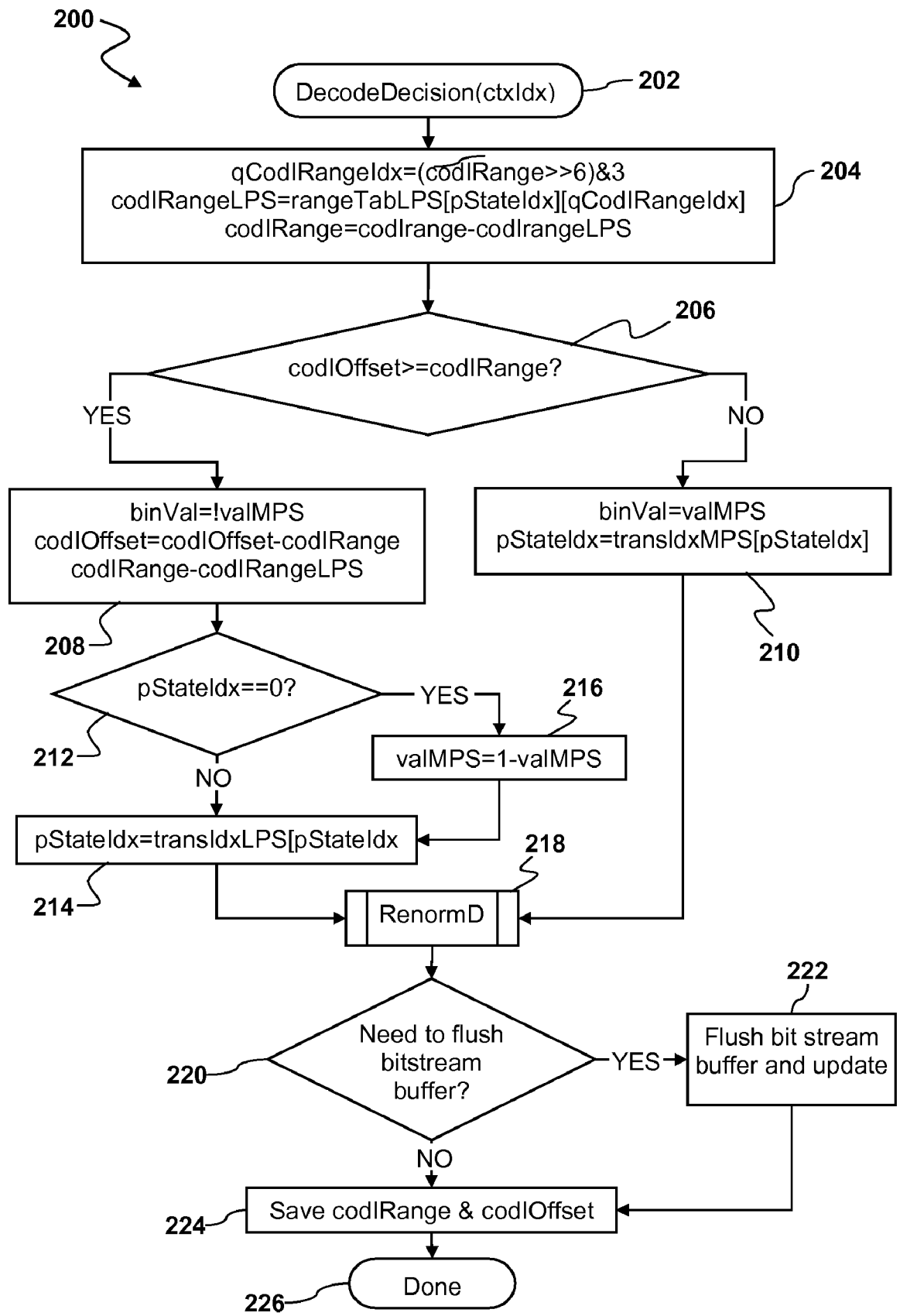
FIG. 2 is a flow diagram illustrating entropy decoding according to the prior art.

The process of arithmetic decoding such as CABAC decoding typically involves a single CABAC engine and hundreds of bin types. When a specific bin is decoded, the inputs are the CABAC engine, and a context associated with the type the decoded bin belongs to. Bin decoding produces the correct binary bin value. In addition, it is desirable to correctly reset the CABAC engine and the context in preparation for future decoding. To understand the nature of the potential bottleneck associated with CABAC decoding it is useful to explain the conventional flow of such decoding. The flow diagram of FIG. 2 illustrates a conventional original algorithm for CABAC decoding, e.g., as provided in the AVC (H.264) standard. As will be explained later in this section, CABAC decoding is basically a sequential process, in the sense that all operations depends on the beginning, intermediate and final values in the CABAC engine. The CABAC engine can only be reset correctly if the starting values in it are correct. Based on reset values, the CABAC engine is then renormalized in preparation for the next round of decoding.

Arithmetic coding is based on the principle of recursive interval subdivision. Given a probability estimation p(0) and p(1)=1−p(0) of a binary decision (0, 1), an initially given code sub-interval with the range codIRange will be subdivided into two sub-intervals having range p(0)*codIRange and codIRange−p(0)*codIRange, respectively. Depending on the decision, which has been observed, the corresponding sub-interval will be chosen as the new code interval, and a binary code string pointing into that interval will represent the sequence of observed binary decisions. It is useful to distinguish between the most probable symbol (MPS) and the least probable symbol (LPS), so that binary decisions may be identified as MPS or LPS, rather than 0 or 1. Given this terminology, each context may be specified by a probability $p_{LPS}$ of the LPS and a value of MPS (valMPS), which is either 0 or 1.

The arithmetic core engine used for decoding AVC(H.264) may be characterized by the following properties. The probability estimation may be performed by means of a finite-state machine with a table-based transition process between 64 different representative probability states $\{p_{LPS}(pStateIdx) | 0<=pStateIdx<64\}$ for the LPS probability $p_{LPS}$. The numbering of the states may be arranged in such a way that the probability state with index pStateIdx=0 corresponds to an LPS probability value of 0.5, with decreasing LPS probability towards higher state indices. The range codIRange representing the state of the coding engine may be quantized to a small set $\{Q_1, \ldots, Q_4\}$ of pre-set quantisation values prior to the calculation of the new interval range. Storing a table containing all 64×4 pre-computed product values of $Q_i * p_{LPS}$ (pStateIdx) allows a multiplication-free approximation of the product codIRange*$p_{LPS}$(pStateIdx). For syntax elements or parts thereof for which an approximately uniform probability distribution is assumed to be given a separate simplified encoding and decoding bypass process may be used. An arithmetic decoder may be regarded as a state machine that performs decoding utilizing syntax elements from the bit-stream. The state may be reset at the beginning of each slice in the bitstream. A block of picture elements (e.g., pixels)

within the slice may be represented in the bitstream by 16 coefficients. In arithmetic decoding, a syntax decoder tries to determine which of the coefficients has a non-zero value. The syntax elements may be regarded as questions asked of the arithmetic decoder. Each question has its own context which answers the question: what is the probability that the answer is 0 or 1?

At each decoding, the values of codIRange and codIOffset are updated. A context table that relates codIRange and codIOffset values to particular is initialized at the beginning of each slice of a picture according to a predetermined formula.

FIG. 2 shows the flowchart for decoding a single decision (DecodeDecision) which starts at 202. The inputs for this process may include Inputs identified as ctxIdx, codIRange, and codIOffset. The input ctxIdx is an index for a context variable associated with the binary decision. Outputs of this process are the decoded value binVal, and the updated variables codIRange and codIOffset. The value of the variable codIRangeLPS may be derived at 204 as follows. Given the current value of codIRange, the variable qCodIRangeIdx may be derived by a bitwise arithmetic shift to the right of the current value of codIRAnge, e.g., by executing an instruction of the type: qCodIRangeIdx=(codIRange>>6) & 0x03, where the operator ">>6" refers to a bitwise arithmetic shift to the right by 6 bits and the operator "& 0x03 refers to a bitwise "and" operation with the value 0x03.

Given the values of qCodIRangeIdx and pStateIdx associated with ctxIdx, the value of the variable rangeTabLPS as specified in a lookup table may be assigned to codIRangeLPS, e.g., by executing the instruction: codIRangeLPS=rangeTabLPS[pStateIdx][qCodIRangeIdx]. An example of the lookup table is Table 9.35 of "Draft of Version 4 of H.264/AVC (ITU-T Recommendation H.264 and ISO/IEC 14496-10 (MPEG-4 part 10) Advanced Video Coding)" by Gary Sullivan, Thomas Wiegand and Ajay Luthra, Joint Video Team (JVT) of ISO/IEC MPEG & ITU-T VCEG (ISO/IEC JTC1/SC29/WG11 and ITU-T SG16 Q.6), 14th Meeting: Hong Kong, CH 18-21 January, 2005 which has been incorporated herein by reference above.

The variable codIRange is set equal to codIRange−codIRangeLPS and the following applies. If at 206 codIOffset is greater than or equal to codIRange, the variable binVal is set equal to 1−valMPS, codIOffset is decremented by codIRange, and codIRange is set equal to codIRangeLPS at 208. Otherwise, the variable binVal is set equal to valMPS as indicated at 210.

Depending on the value of binVal, a state transition may be performed. Depending on the current value of codIRange, a renormalization may be performed at 218. Inputs to the state transition process may include a current value of an index pStateIdx, the decoded value binVal and valMPS values of the context variable associated with ctxIdx. Outputs of this process may include the updated pStateIdx and valMPS of the context variable associated with ctxIdx. Depending on the decoded value bin Val, the update of the two variables pStateIdx and valMPS associated with ctxIdx may be derived as follows. If binVal is equal to valMPS the value of pStateIdx is set equal to transIdxMPS(pStateIdx) at 214 as determined by a lookup table. If binVal is not equal to valMPS and if at 212 pStateIdx is equal to 0 valMPS is set equal to 1−valMPS at 216. If at 212 pStateIdx is not equal to 0 then pStateIdx is set equal to transIdxLPS(pStateIdx) at 214 as determined by the lookup table. By way of example, Table 9-36 of "Draft of Version 4 of H.264/AVC (ITU-T Recommendation H.264 and ISO/IEC 14496-10 (MPEG-4 part 10) Advanced Video Coding)" is an example of a suitable lookup table specifying the transition rules transIdxMPS( ) and transIdxLPS( ) after decoding the value of valMPS and 1−valMPS, respectively.

Figure 3:
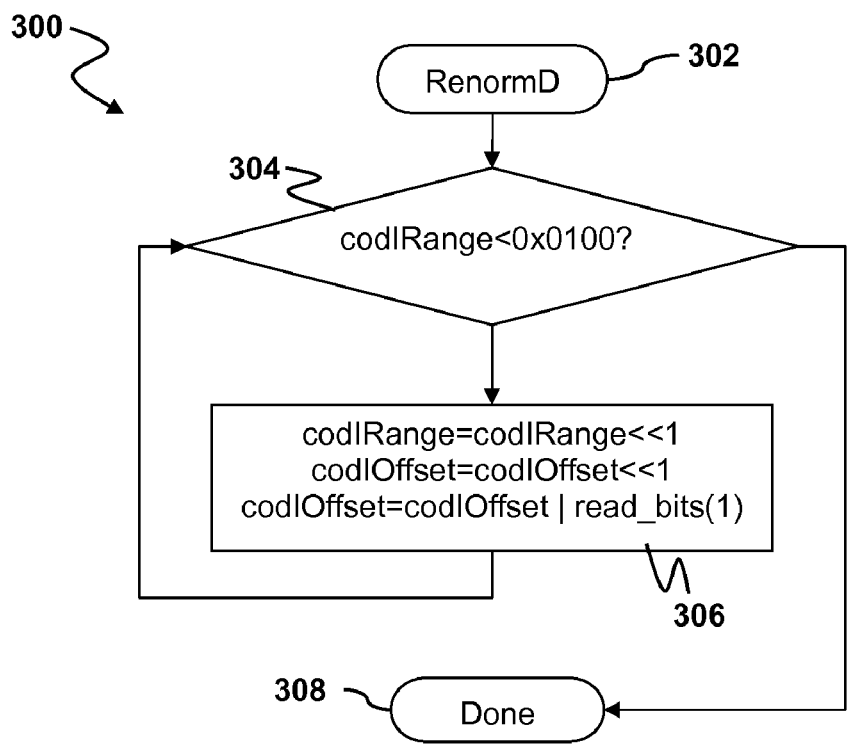
FIG. 3 is a flow diagram illustrating renormalization during entropy decoding.

The renormalization at 218 may be required if the decoding at 208 or 210 resets codIRange to some value that is less than 256, i.e., less than 9 bits. The renormalization process shifts the bits in codIRange to the left so that codIRange is greater than 256. By way of example the renormalization process 218 may proceed as shown in the flow diagram in FIG. 3. Inputs to a renormalization process 300 may include bits from slice data and the variables codIRange and codIOffset. Outputs of this process may include the updated variables codIRange and codIOffset. Referring to FIG. 3, the process 300 may be triggered by a call to an instruction RenormD 302. The current value of codIRange is first compared to 0x0100 at 304. If codIRange is greater than or equal to 0x0100, no renormalization is needed and the RenormD process is finished, as indicated at 308. Otherwise (codIRange is less than 0x0100), the renormalization loop is entered at 306. Within this loop, the value of codIRange is doubled, i.e., left-shifted by 1 and a single bit is shifted into codIOffset by using read_bits (1). The loop continues until codIRange is greater than or equal to 0x0100, at which point the renormalization process 300 is finished at 308. It is desirable that the bitstream not contain data that results in a value of codIOffset being greater than or equal to codIRange upon completion of this process.

The bits that make up codIOffset may be drawn from a raw bitstream and temporarily stored in a buffer. Once the renormalization has been completed at 218, e.g., as illustrated in FIG. 3, it may be necessary to flush the bitstream. If at 220 it is determined that the bitstream buffer is empty (or nearly empty) the bitstream buffer is flushed and updated at 222 and the values of codIRange and codIOffset are saved at 224 and the process is finished at 226. If the bitstream does not need to be flushed, the values of codIRange and codIOffset are saved at 224 and the process is finished at 226. A subsequent decoding of another section of the bitstream may then take place, e.g., starting again at 202.

The drawbacks to the above-described arithmetic decoding process may be seen from FIG. 2 and FIG. 3. FIG. 2 contains branches at 206, 212, within the renormalization process at 218 and at 220. These branches do not lend themselves to efficient implementation on parallel processing machines such as the Cell. In addition, the branches may inhibit the performance of even non-parallel processors. For example, certain processors, such as the PC, may include a single instruction multiple data (SIMD) processor similar to that of a Cell. The above-described process does not lend itself to taking advantage of computational efficiencies that can be attained through use of the SIMD processor. To overcome these disadvantages, embodiments of the present invention make use of an arithmetic decoding process that avoids the use of branches where it is practical to do so.

Figure 4A:
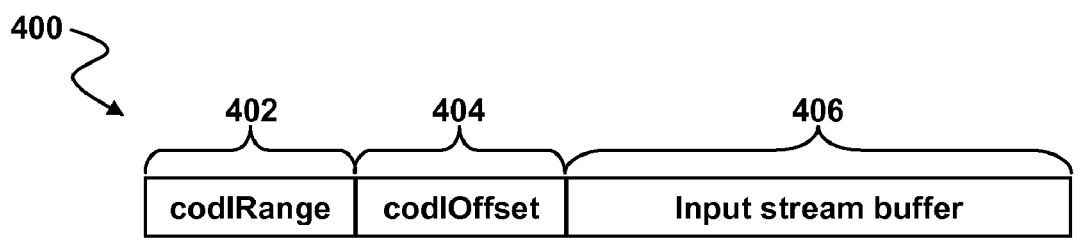
FIG. 4A is a schematic diagram illustrating an entropy decoding engine vector according to an embodiment of the present invention.

The algorithm associated with FIG. 2 and FIG. 3 may be categorized as a scalar style algorithm. To improve efficiency and speed of processing, embodiments of the invention may utilize a vector-type data packing scheme. The data packing scheme may be understood with respect to FIG. 4A and FIG. 4B. The schematic diagram of FIG. 4A depicts an entropy decoding engine vector 400 according to an embodiment of the present invention. The engine vector 400 generally includes a plurality of bits broken into three or more sections. A first section 402 includes bits corresponding to the value of codIRange. A second section 404 includes bits corresponding to the value of codIOffset. A third section 406 includes bits corresponding to an input stream buffer. The bits in the third section may be obtained from an input bitstream.

The packing of data the codIRange, codIOffset and buffered input stream data into a single vector can be configured to take advantage of the available space for data in registers used by a processor that implements embodiments of the invention. For example, the first, second and third sections may encompass a total number of bits less than or equal to the number of bits that can be stored in a register of the processor. Specifically, in the case of a process that utilizes 128-bit registers, the first section 402 may accommodate 16 bits for codIRange, the second section 404 may accommodate 16 bits for codIOffset and the third section 406 may accommodate 96 bits for buffered input data from the bitstream. Embodiments of the invention are not limited to this particular packing scheme. The sections 402, 404, 406 may include different numbers of bits and different entropy decoding data. In addition the engine vector 400 may include more or fewer than three sections. By packing the data into a vector of the type shown in FIG. 4A, entropy decoding processes may be implemented using fewer read operations, thereby significantly speeding up processing. In addition, packing data into vectors allows the use of SIMD processing for entropy decoding.

Figure 4B:
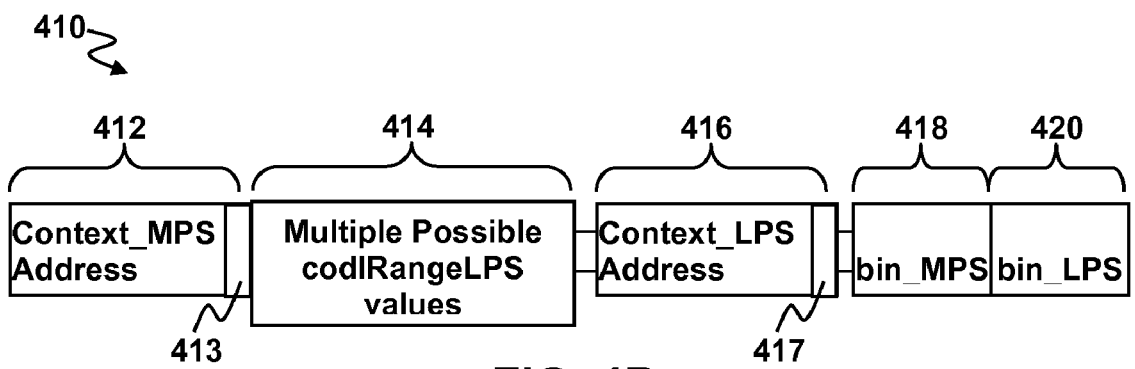
FIG. 4B is a schematic diagram illustrating a Context vector according to an embodiment of the present invention.

Data packing of the type depicted in FIG. 4A may be extended to other data used in entropy decoding. For example, FIG. 4B is a schematic diagram illustrating a Context vector 410 according to an embodiment of the present invention. The context vector 410 may include first, second, third, fourth and fifth sections 412, 414, 416, 418 and 420. The first section 412 may accommodate bits corresponding to an address of a context most probable state. The second section 414 may accommodate bits corresponding to multiple possible codIRangeLPS values. The third section 416 may accommodate bits corresponding to an address of a context least probable state. The fourth section 418 may accommodate bits corresponding to a binary most probable state value bin_MPS. The fifth section 420 may accommodate bits corresponding to a binary least probable state value bin_LPS. These sections may accommodate any number if bits and need not encompass as many or fewer bits as are available in a single register. By way of example and without loss of generality, the first section 412 may accommodate 32 bits, e.g., corresponding to byte positions 0,1,2 and 3, the second section 414 may accommodate 32 bits, e.g., corresponding to byte positions 4, 5, 6, and 7, the third section 416 may accommodate 16 bits, and the fourth and fifth sections 418, 420 may accommodate 8 bits each. Embodiments of the invention are not limited to this particular packing scheme. The sections 412, 414, 416, 418, 420 may include different numbers of bits and different types of context data for entropy decoding. In addition the context vector 410 may include more or fewer than five sections. By packing the data into a vector of the type shown in FIG. 4B, entropy decoding processes may be implemented using fewer read operations, thereby significantly speeding up processing.

In embodiments of the present invention the first and third sections 412, 416 may include subsections of bits 413, 417 that provide indexes pointing to address for new contexts in the MPS and LPS cases respectively. Such indexes have conventionally been six bit values. If the value of an index was all zeros, this meant that the bin_MPS value associated with the new context should be flipped from 1 to 0 or from 0 to 1. However, determining whether to flip required a branch instruction. In some embodiments of the present invention, the value of the new bin_MPS may be absorbed into the new context addresses for the MPS and LPS cases. Specifically, the indexes within the first and third sections 412, 416 may contain an extra bit indicating whether the new context has a bin.MPS value of 1 or zero. The extra bit doubles the number of possible contexts. Consequently, twice as many contexts would be stored in memory with half of the contexts having a bin_MPS value of 0 and half having a bin_MPS value of 1. If the last bit of an index 413, 417 is a 0, the address of the new context contains a context having a bin_MPS of 0. If the last bit of the index is a 1, the address of the new context contains a context having a bin_MPS of 1. Such a configuration of the Context vector 400 and the contexts stored in memory avoids having to take a branch to determine whether to flip the bin_MPS value.

Figure 5:
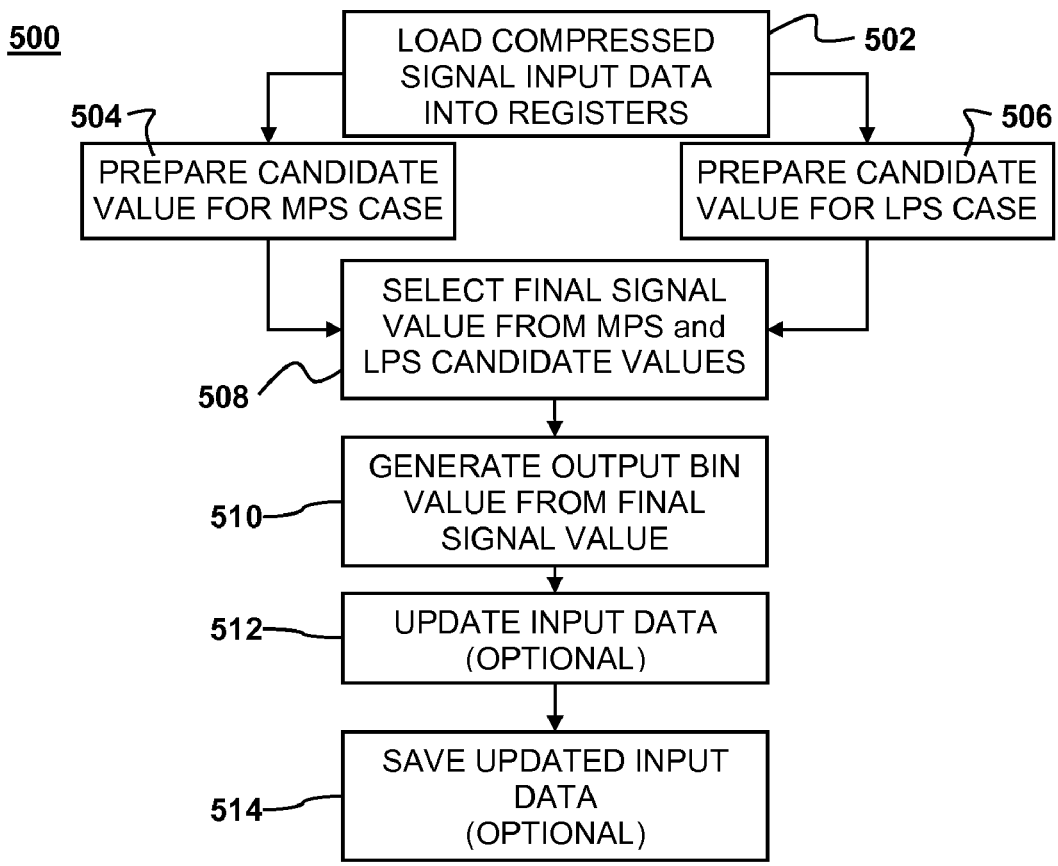
FIG. 5 is a flow diagram illustrating entropy decoding according to an embodiment of the present invention.

FIG. 5 illustrates a flow diagram for a method 500 of entropy decoding according to an embodiment of the present invention. In the method 500 compressed signal input data representing one or more signals is loaded into one or more registers of a processor at 502. By way of example, the compressed signal input data may include a CABAC engine vector of the type depicted in FIG. 4A and a context vector of the type depicted in FIG. 4B. After the input data is loaded a first candidate value for a most probable signal case is prepared (e.g., computed) from the input data at 504. A second candidate value is prepared (e.g., computed) for a least probable signal case from the input data at 506. In embodiments of the present invention, the first and second candidate values may be prepared independently of each other at 504 and 506. As used in the preceding context, the expression "independently" means that the preparation of the first candidate value does not require the preparation of the second candidate value and vice versa. Independent preparation of the first and second candidate values at 504 and 506 may occur substantially concurrently (i.e., with some degree of overlap in time) or non-concurrently (i.e., without overlap in time). It is noted that independent preparation may involve the parallel computation of the first and second candidate values on different processors. Alternatively, independent preparation of the first and second candidate values may involve the computation of the first and second candidate values using a single processor having SIMD capability.

Once the first and second candidate values have been prepared a final signal value for the one or more signals may be selected from the first and second candidate values at 508. By way of example, selection of the final signal value may involve operating on one or both candidate values with a selection mask. An example of the use of such a selection mask is described with respect to FIG. 7 below. An output bin value may then be generated at 510 based on the final signal value. The input data may then optionally be updated at 512 based on the final signal value and/or output bin value. The resulting updated input data from 512 may optionally saved, e.g., to a memory or other storage at 514.

Figure 6:
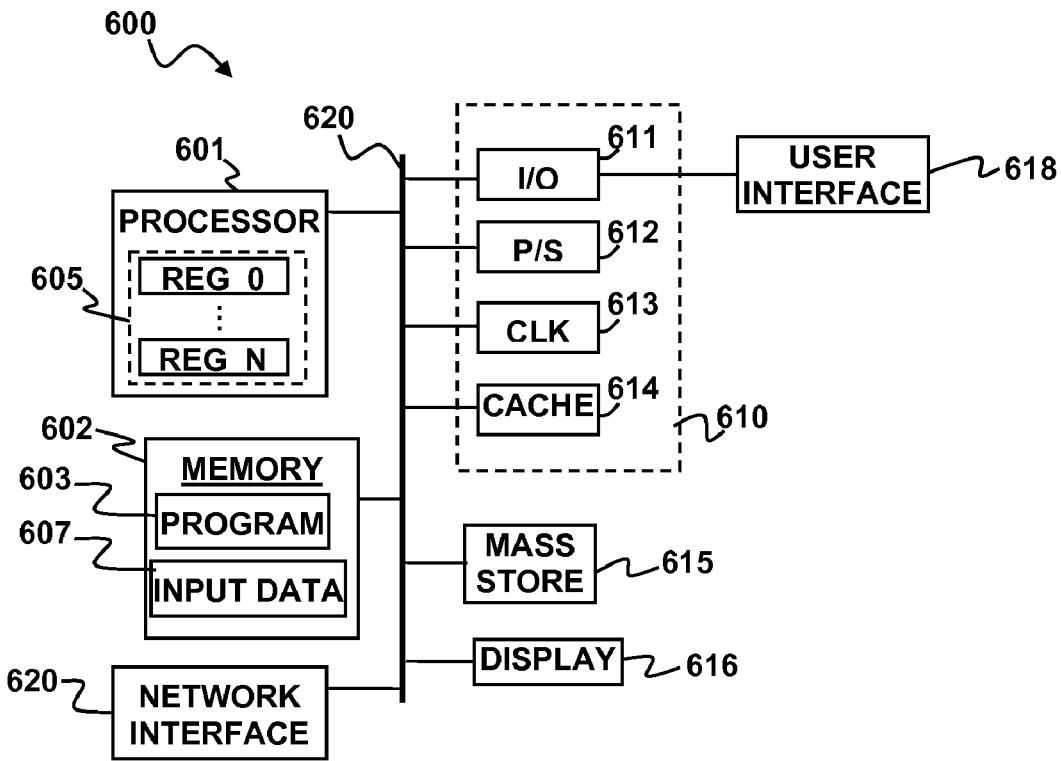
FIG. 6 is a block diagram illustrating a CABAC decoding apparatus according to an embodiment of the present invention.
Figure 8:
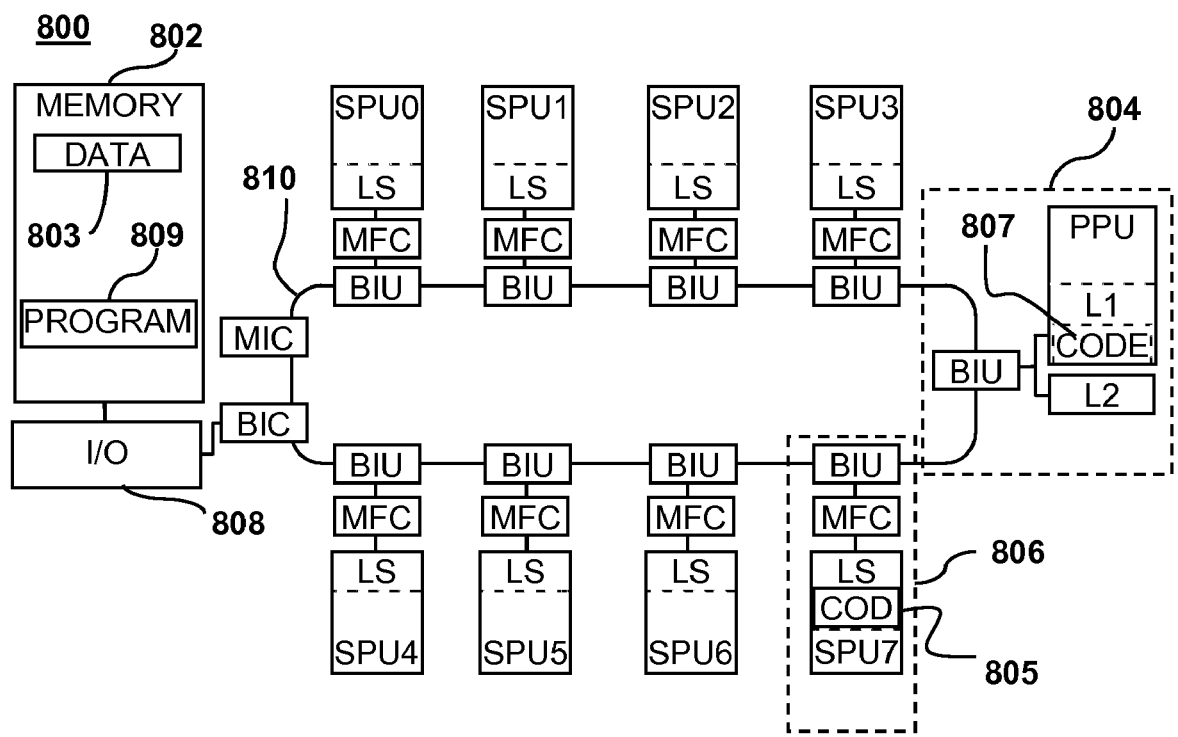
FIG. 8 is a block diagram illustrating an example of a cell processor implementation of CABAC decoding according to an embodiment of the present invention.

FIG. 6 illustrates a block diagram of a computer apparatus 600 for such real time computer simulation. The apparatus 600 generally includes may include a processor module 601 and a memory 602. The processor module 601 module may include a single processor or multiple processors. As an example of a single processor, the processor module 601 may include a Pentium microprocessor from Intel or similar Intel-compatible microprocessor. As an example of a multiple processor module, the processor module 601 may include a cell processor, an example of which is discussed below with respect to FIG. 8.

The memory 602 may be in the form of an integrated circuit, e.g., RAM, DRAM, ROM, and the like). The memory may also be a main memory or a local store of a synergistic processor element of a cell processor. A computer program 603 may be stored in the memory 602 in the form of processor readable instructions that can be executed on the processor module 601. The processor module 601 may include one or more registers 605 into which data 607, such as the compressed signal input data may be loaded. The compressed signal data may be packed, e.g., as described above with respect to FIG. 4A and FIG. 4B, to reduce the number of memory reads needed to load the data into the registers 605. The instructions of the program 603 may include the steps of the method of entropy decoding, e.g., as described above with respect to FIG. 5 or as described with respect to FIG. 7 below. The program 603 may be written in any suitable processor readable language, e.g., C, C++, JAVA, Assembly, MATLAB, FORTRAN and a number of other languages. The apparatus 600 may also include well-known support functions 610, such as input/output (I/O) elements 611, power supplies (P/S) 612, a clock (CLK) 613 and cache 614. The device 600 may optionally include a mass storage device 615 such as a disk drive, CD-ROM drive, tape drive, or the like to store programs and/or data. The device 600 may also optionally include a display unit 616 and user interface unit 618 to facilitate interaction between the device 600 and a user. The display unit 616 may be in the form of a cathode ray tube (CRT) or flat panel screen that displays text, numerals, graphical symbols or images. The user interface 618 may include a keyboard, mouse, joystick, light pen or other device that may be used in conjunction with a graphical user interface (GUI). The apparatus 600 may also include a network interface 620 to enable the device to communicate with other devices over a network, such as the internet. These components may be implemented in hardware, software or firmware or some combination of two or more of these.

Figure 7:
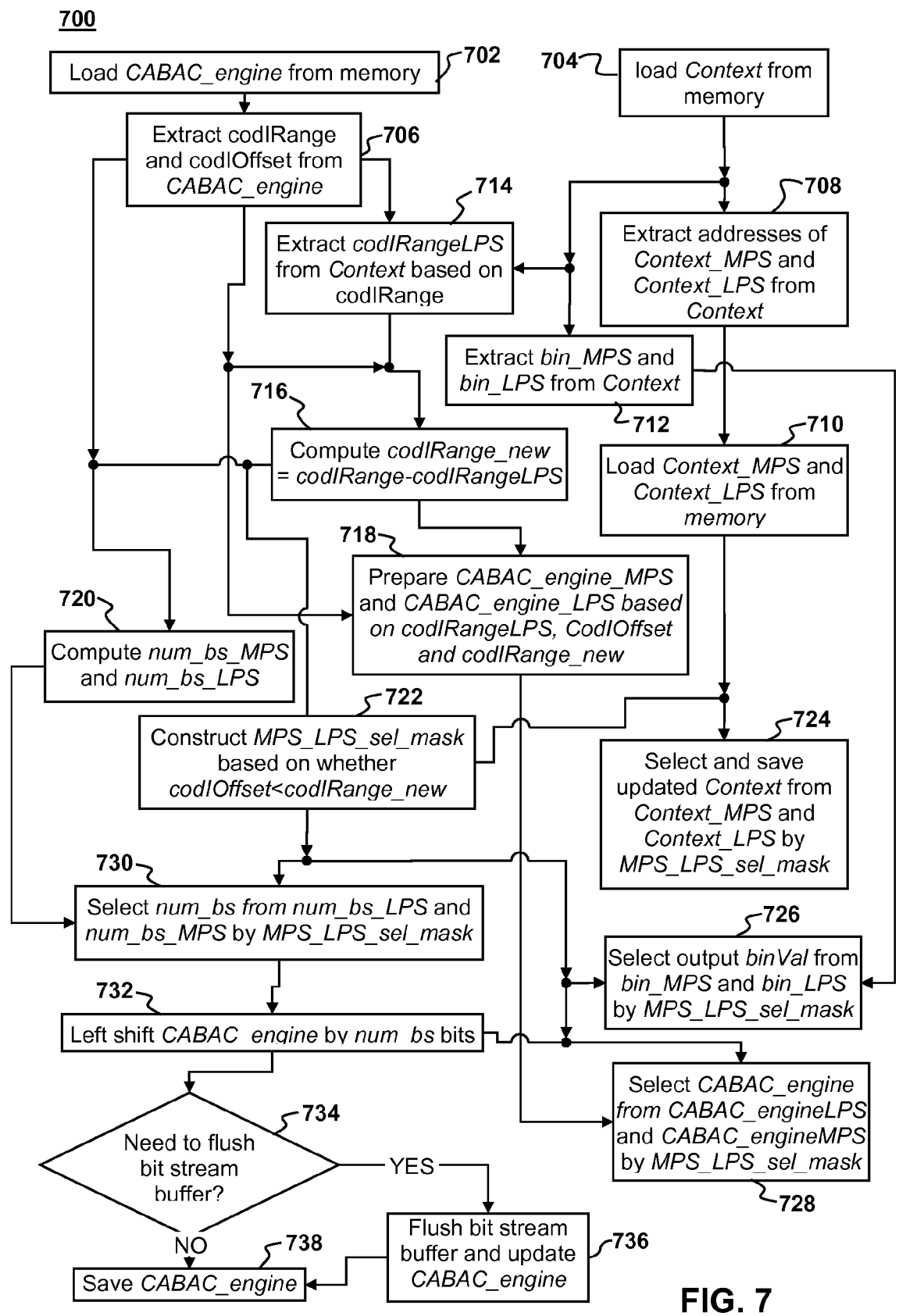
FIG. 7 is a block diagram illustrating an apparatus for CABAC decoding according to an embodiment of the present invention.

There are a number of different possible implementations of the processes within the method 500 of FIG. 5 for entropy decoding according to embodiments of the present invention. FIG. 7 illustrates one possible implementation in the context of CABAC decoding. This method may be applied to other forms of arithmetic decoding other than CABAC decoding. Furthermore, arithmetic decoding has applications in addition to video decoding. For example, the image compression standard known as JPEG 2000 uses a form of arithmetic coding for encoding non-video images. The method of FIG. 5 and FIG. 7 may therefore be applied to arithmetic decoding of such images. As such, embodiments of the present invention are not limited applications involving CABAC decoding.

The method 700 may be understood by referring simultaneously to FIG. 6 and FIG. 7. At 702 a vector of the type shown in FIG. 4A referred to as CABAC_engine is loaded into one or the registers 605 from the memory 602. At 704, a vector of the type shown in FIG. 4B referred to as Context is loaded into a different one of the registers 605 from the memory 602. At 706 extracts two scalars, codIRange and codIOffset are extracted from the CABAC_engine vector. At 708 addresses of a context least probable state (referred to as Context_LPS) and a context most probable state (referred to as Context_MPS) are extracted from the Context vector. The addresses extracted at 708 are used at 710 to prepare updates to the Context vector for both the MPS and LPS cases. At 712 bin values both in MPS and LPS cases are prepared, e.g., by extracting them from the Context vector.

At 714 an interim value codIRangeLPS is extracted from the Context vector based on the value of codIRange from the CABAC_engine vector. The value of codIRange provides an index for picking one of four possible codIRangeLPS values. These possible values may be stored at different byte positions within codIRange. The index may be stored in a subset of the bits that make up codIRange, e.g., the leading three bits. Meaningless bits within codIRange may be removed by shifting codIRange to the right by a suitable number of bits. The remaining bits may then be used as an index for a table lookup that identifies a byte position within the Context vector containing the desired codIRangeLPS value. This may be implemented very fast using registers. By way of example, codIRange may be configured such that the first bit of the index is always a 1, e.g., by ensuring that the leading bit of codIRange is always a 1. If codIRange has 9 bits with the leading bit being a 1, the index may be obtained by shifting codIRange by six bits to the right. In such a case, the index ranges from 4 to 7, which correspond to byte positions 4 to 7 within the Context vector.

At 716 an interim value codIRange_new is computed using codIRange_new=codIRange−codIRangeLPS. The interim values codIRangeLPS and codIRange_new are used in updating the CABAC_engine vector as described below.

At 718 the value of codIRange_new is used in conjunction with codIRangeLPS and codIRangeOffset to construct first and second candidate values for updates to the CABAC_engine vector. These candidate values are referred to as CABAC_engine_MPS and CABAC_engine_LPS in FIG. 7. The candidate values CABAC_engine_MPS and CABAC_engine_LPS may be computed as pre-renormalized versions of the updates of the CABAC_engine. The candidate values of CABAC_engine may be said to be pre-renormalized based on the values of the bits corresponding to codIRange. In some embodiments, the value of leading bit in codIRange may be required to be a 1. This may not be the case for the computed candidate values CABAC_engine_MPS and CABAC_engine_LPS. To satisfy the requirement, both candidate values may be renormalized by removing any leading zeros. To implement the renormalization, the number of bits to shift in CABAC engine renormalization is calculated at 720 for both the MPS case and LPS case. In FIG. 7, num_bs_MPS represents the number of bits by which to left shift CABAC_engine_MPS and num_bs_LPS represents the number of bits by which to left shift CABAC_engine_LPS. The values of num_bs_MPS and num_bs_LPS may be determined with instructions that count the number of leading zeros in the codIRange for each of the candidate values. By renormalizing both candidate values, the renormalization loop shown in FIG. 3 may be avoided. Avoiding the renormalization loop avoids the use of a branch instruction that could otherwise produce branch stalls and slow down entropy decoding. Avoiding such stalls can greatly improve the speed and efficiency of entropy decoding.

At 722 it is determined whether if it is a MPS case or LPS case. For example if codIOffset is less than codIRange_new it is a MPS case and the value of the CABAC_engine vector is to be updated to the CABAC_engine_MPS candidate value. Otherwise, it is a LPS case and the value of the CABAC_engine vector is to be updated to the CABAC_engine_LPS candidate value. To facilitate updating at 722, a selection mask MPS_LPS_sel_mask may be constructed for later comparison against CABAC_engine_MPS and CABAC_engine_LPS and/or for comparison against Context_MPS and Context_LPS. If the selection mask MPS_LPS_sel_mask is used for comparison against CABAC_engine_MPS and CABAC_engine_LPS and for comparison against Context_MPS and Context_LPS it may be desirable for MPS_LPS_sel_mask to have at least as many bits as the greatest number of bits in any of CABAC_engine_MPS, CABAC_engine_LPS, Context_MPS and Context_LPS. The values of the bits in MPS_LPS_sel_mask may be based on whether codIOffset is less than codIRange_new. For example, if codIOffset is greater than codIRange_new every bit in MPS_LPS_sel_mask may be set to 1. Otherwise, every bit in MPS_LPS_sel_mask may be set to 0.

At 724 the correct update to the Context vector may be determined using Context_MPS, Context_LPS and the selection mask MPS_LPS_sel_mask. By way of example, a bitwise selection operation of the type Result=select(A, B, mask) may be used to select between Context_MPS and Context_LPS the correct value to update the Context vector. In this type of operation each bit of A and each corresponding bit of B may be compared against a corresponding bit in mask. If, for example, a given bit from mask is set equal to zero the corresponding bit in Result is equal to the value of the corresponding bit in A. If the given bit from mask is equal to one the corresponding bit in Result is set equal to the value of the corresponding bit in B. Thus, the updated value of Context may be determined using an instruction such as Context=select(Context_MPS, Context_LPS, MPS_LPS_sel_mask). Since the value of all the mask bits was set equal to either one or zero at 722 the result of this instruction will be equal to either Context_MPS or Context_LPS depending on whether codIOffset was less than codIRange_new at 722. The updated value of Context may be saved to memory 602 and/or mass storage 615 at 724.

A selection instruction utilizing the MPS_LPS_sel_mask may determine an output bin value binVal from bin_MPS and bin_LPS at 726. By way of example, such an instruction may have the form:

binVal=select(bin_MPS, bin_LPS, MPS_LPS_sel_mask).

Furthermore, at 728, the correct pre-renormalized version of the update CABAC_engine may also be determined through use of a selection operation using the MPS_LPS_sel_mask. By way of example, such an instruction may have the form:

bin Val=select(CABAC_engine_MPS, CABAC_engine_LPS, MPS_LPS_sel_mask).

The pre-renormalized CABAC_engine vector may be then be renormalized as follows. At 730 gets the correct number of bits by which to shift the pre-renormalized CABAC_engine vector during renormalization may be determined by a selection operation using the MPS_LPS_sel_mask. Again this operation may use an instruction having the form:

num_bs=select(num_bs_MPS, num_bs_LPS, MPS_LPS_sel_mask).

The pre-renormalized CABAC_engine vector may then be renormalized at 732, e.g., by left-shifting the CABAC_engine vector by the number of bits num_bs calculated at 730. It is noted that this single shifting instruction performs function equivalent to the renormalization loop 300 of FIG. 3 without utilizing a branch instruction. If codIRange and codIOffset are packed into a single CABAC_engine vector, e.g., as shown in FIG. 4A, both values may be renormalized by the same instruction at 732. After renormalization it may be determined at 734 if the bit-stream buffer in CABAC_engine is close to empty. If so, at 736 the bit-stream buffer may be refilled with fresh bits from the input bit-stream before saving the CABAC_engine vector back to memory 602 at 738. If not, the CABAC_engine vector may be saved without refilling. Saving the CABAC_engine vector to memory 602 at 738 may conclude the process of updating to the CABAC_engine vector.

It is noted that the above method 700 largely avoids the use of branch instructions except for checking the bit stream buffer at 734. It is noted that this particular branch instruction is a rather biased branch, i.e., a branch for which one particular path is much more likely than the other. In general, it is more likely that flushing the bit stream won't be required. Statistically, it is roughly 100 times more likely that bit stream flushing will not be required that it will be required. In such a case branch stalls may be reduced through the use of branch prediction, such as a static branch prediction. The reduction in branch instructions can speed up the process of entropy decoding whether on a parallel processor or a conventional processor such as a PC.

As may be deduced from FIG. 7 and the foregoing description, a general method of avoiding a branch instruction in a processor algorithm may be summarized in the following way. A first result value from input data may be computed based on a first condition. A second result value may be computed from the input data based on a second condition. A value of one or more bits of a mask may be set based on whether the first or second condition is true. Either the first or second result may then be selected by comparing the first and second results against the mask without using a branch instruction. Such a method can be used in applications other than entropy decoding of video images. For example, embodiments of the present invention may be applied to decoding of non-video images that have been compressed using a standard, such as JPEG 2000, that utilizes arithmetic coding standard.

The method of FIG. 5 and/or the method of FIG. 7 may be implemented with a processing module capable of implementing parallel processing. One example, among others of a processing module capable of implementing parallel processing is a cell processor. There are a number of different processor architectures that may be categorized as cell processors. By way of example, the cell processor 800 may be characterized by an architecture known as Cell Broadband engine architecture (CBEA)—compliant processor. Cell processors that utilize this type of architecture are described in detail, e.g., in *Cell Broadband Engine Architecture*, which is available online at http://www-306.ibm.com/chips/techlib/techlib.nsf/techdocs/1AEEE1270EA2776387257060006E61BA/$ file/CBEA_01_pub.pdf, which is incorporated herein by reference.

For the purposes of example, the cell processor 800 is depicted as having only a single SPE group and a single PPE group with a single SPE and a single PPE. Alternatively, a cell processor can include multiple groups of power processor elements (PPE groups) and multiple groups of synergistic processor elements (SPE groups). Hardware resources can be shared between units within a group. However, the SPEs and PPEs must appear to software as independent elements.

The cell processor 800 includes a main memory 802, a single PPE 804 and eight SPEs 806. However, the cell processor 800 may be configured with any number of SPE's. With respect to FIG. 8, the memory, PPE, and SPEs can communicate with each other and with an I/O device 808 over a ring-type element interconnect bus 810. The memory 802 contains input data 803 having features in common with the input data 607 described above and a program 809 having features in common with the program 603 described above. At least one of the SPE 806 may include in its local store entropy decoding instructions 805 having features in common with the program 603 described above. The PPE may include in its L1 cache, code 807 instructions of an overall program of which the program 809 is a part. Instructions 805, 807 may also be stored in memory 802 for access by the SPE and PPE when needed.

It is noted that a Cell's SPE becomes most efficient when it processes vectors in its register file and accesses its local memory by vectors. In CABAC decoding algorithms of the type described with respect to FIG. 5 and FIG. 7, the data may be repacked in vectors, e.g., as shown in FIG. 4A and FIG. 4B. By repacking the data in this manner, the SPE's efficiency in processing and memory access may be greatly utilized. Considering hardware complexity, SPEs in a Cell may not have circuitry for dynamic branch prediction. To avoid CPU stall caused by the program branching, almost all of the branches in the generic algorithm provided in the AVC(H.264) standard of FIG. 2 and FIG. 3 may be removed as described above. An SPE has 2 instruction pipelines, which means that it is able to issue two instructions in one cycle provided there is no conflict. An algorithm of the type shown in FIG. 5 and FIG. 7 may therefore be crafted to make the most of the SPE's dual issuing capability.

Compared with the scalar style algorithm provided in the AYC(H.264) standard (e.g., as described with respect to FIG. 2 and FIG. 3) an algorithm of the type shown in FIG. 7 may perform CABAC decoding significantly faster on a Cell processor. Without this improvement, most of the Cell processor's computing power would otherwise be wasted and it would be almost impossible to decode high definition CABAC streams in real time. Therefore, in preferred embodiments, CABAC decoding may be implemented on the SPEs of a Cell processor using an algorithm of the type described above with respect to FIG. 7. It is also a good choice to run it on a PowerPC based processor, because the SIMD unit of PowerPC is very similar to a SPE. With little or no modifications, CABAC decoding algorithms of the type described with respect to FIG. 5 and FIG. 7 can offer significantly improved computational performance on nearly any processor having the virtues of efficient vector processing, faster memory access in unit of vectors, as well as multiple instruction pipelines. Examples of such processors include almost all modem microprocessors such as Pentium series microprocessors from Intel Corporation of Santa Clara, Calif. and Athlon series microprocessors from Advanced Micro Devices, Inc. (AMD) of Sunnyvale, Calif.

Experiments have been performed show that the new CABAC decoding algorithm greatly utilizes the computing power offered by SPEs and is over 5 times faster than the generic algorithm provided in the AVC (H.264) standard. As a result, a Cell processor alone is capable of decoding high bit rate streams targeted by the Blu-ray standard with reasonable performance margin.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for entropy decoding, comprising:
   loading compressed input data representing one or more signals into one or more registers;
   preparing a first candidate value for a most probable signal case from the input data;
   preparing a second candidate value for a least probable signal case from the input data;
   selecting a final signal value for the one or more signals from the first and second candidate values; and
   generating an output bin value based on the final signal value.

2. The method of claim 1 wherein the input data includes a CABAC engine vector and a context vector.

3. The method of claim 2 wherein the CABAC engine vector includes:
   a first set of bits representing a codIRange value,
   a second set of bits representing a codIOffset value; and
   a third set of bits representing the contents of an input stream buffer.

4. The method of claim 3 wherein a total number of bits in the first, second and third sets of bits equals a maximum number of bits that can fit in the one or more registers.

5. The method of claim 4 wherein the total number of bits in the first, second and third sets of bits equals 128.

6. The method of claim 5 wherein the number of bits in the first set of bits is sixteen, wherein the number of bits in the second set of bits is sixteen and wherein the number of bits in the third set of bits is ninety-six.

7. The method of claim 3 wherein the context vector includes:
   a first set of bits representing a Context_MPS Address,
   a second set of bits representing a plurality of possible codIRangeLPS values,
   a third set of bits representing a Context_LPS Address,
   a fourth set of bits representing a bin_MPS value; and
   a fifth set of bits representing a bin_LPS value.

8. The method of claim 7 wherein the second set of bits represents four possible codIRangeLPS values.

9. The method of claim 7 wherein the first and/or third set of bits includes a subset of bits represents an index that points to an address of a new context, wherein the index includes a bit indicating a bin_MPS value for the new context.

10. The method of claim 1 wherein the one or more registers include one or more registers in a synergistic processor element (SPE) of a Cell processor.

11. The method of claim 1, further comprising updating the input data to produce updated input data.

12. The method of claim 11, further comprising saving the updated input data.

13. The method of claim 11, further comprising renormalizing the updated input data to produce renormalized updated input data and saving the renormalized updated input data to a memory.

14. The method of claim 13 wherein renormalizing the updated input data includes left shifting a vector containing a codIRange value and a codIOffset value by one or more bits.

15. The method of claim 1, wherein selecting a final signal value for the one or more signals from the first and second candidate values is performed without the use of a branch instruction.

16. The method of claim 15 wherein selecting the final signal value includes:
   generating a selection mask based on whether a value of a codIRange from the input data is less than a value of a codIOffset from the input data and selecting the final signal value from the first and second candidate values using the selection mask.

17. The method of claim 1 wherein selecting the final signal value for the one or more signals from the first and second candidate values and generating the output bin value based on the final signal value is implemented without the use of branch instructions.

18. The method of claim 1 wherein loading the compressed input data, preparing the first and second candidate values, selecting the final signal value and generating the output bin value are implemented on an SPE of a cell processor.

19. The method of claim 1 wherein loading the compressed input data, preparing the first and second candidate values, selecting the final signal value and generating the output bin value are implemented on a microprocessor that utilizes a single instruction multiple data (SIMD) capability.

20. An apparatus for entropy decoding, comprising:
- a processor module having a processor with one or more registers;
- a memory operably coupled to the processor; and
- a set of processor executable instructions adapted for execution by the processor, the processor executable instructions including:
- one or more instructions that when executed on the processor load compressed input data representing one or more signals into the one or more registers from the memory;
- one or more instructions that when executed on the processor prepare a first candidate value for a most probable signal case from the input data;
- one or more instructions that when executed on the processor prepare a second candidate value for a least probable signal case from the input data;
- one or more instructions that when executed on the processor select a final signal value for the one or more signals from the first and second candidate values; and
- one or more instructions that when executed on the processor generate an output bin value based on the final signal value.

21. The apparatus of claim 20 wherein the processor module includes two or more processor elements.

22. The apparatus of claim 21 wherein the processor module is a cell processor having one or more synergistic processor elements (SPE), wherein each SPE includes a synergistic processor unit (SPU) and a local store.

23. The apparatus of claim 22 wherein the processor is a SPE and the memory is the local store of the SPE.

24. The apparatus of claim 20 wherein the input data includes a CABAC engine vector and a context vector.

25. The apparatus of claim 24 wherein the CABAC engine vector includes:
- a first set of bits representing a codIRange value,
- a second set of bits representing a codIOffset value; and
- a third set of bits representing the contents of an input stream buffer.

26. The apparatus of claim 25 wherein a total number of bits in the first, second and third sets of bits equals a maximum number of bits that can fit in the one or more registers.

27. The apparatus of claim 26 wherein the total number of bits in the first, second and third sets of bits equals 128.

28. The apparatus of claim 27 wherein the number of bits in the first set of bits is sixteen, wherein the number of bits in the second set of bits is sixteen and wherein the number of bits in the third set of bits is ninety-six.

29. The apparatus of claim 24 wherein the context vector includes:
- a first set of bits representing a Context_MPS Address,
- a second set of bits representing a plurality of possible codIRangeLPS values,
- a third set of bits representing a Context_LPS Address,
- a fourth set of bits representing a bin_MPS value; and
- a fifth set of bits representing a bin_LPS value.

30. The apparatus of claim 29 wherein the second set of bits represents four possible codIRangeLPS values.

31. The apparatus of claim 29 wherein the first and/or third set of bits includes a subset of bits represents an index that points to an address in the memory of a new context, wherein the index includes a bit indicating a bin_MPS value for the new context.

32. A processor readable medium having embodied therein processor readable instructions for implementing a method for entropy decoding, the method comprising:
- loading compressed input data representing one or more signals into one or more registers;
- preparing a first candidate value for a most probable signal case from the input data;
- preparing a second candidate value for a least probable signal case from the input data;
- selecting a final signal value for the one or more signals from the first and second candidate values; and
- generating an output bin value based on the final signal value.

* * * * *